United States Patent [19]

Nakayoshi et al.

[11] Patent Number: 5,173,765
[45] Date of Patent: * Dec. 22, 1992

[54] CONDUCTIVE ADHESIVE AND ARTICLE MADE THEREWITH

[75] Inventors: Kazumi Nakayoshi; Katsutoshi Mine, both of Chiba Prefecture, Japan

[73] Assignee: Dow Corning Toray Silicone Co., Ltd., Tokyo, Japan

[*] Notice: The portion of the term of this patent subsequent to Sep. 8, 2009 has been disclaimed.

[21] Appl. No.: 619,842

[22] Filed: Nov. 29, 1990

[30] Foreign Application Priority Data

Nov. 30, 1989 [JP] Japan .................. 1-311013

[51] Int. Cl.$^5$ .................. H01L 23/28; H01L 23/48
[52] U.S. Cl. .................. 257/783; 428/447; 528/15; 437/219; 437/211; 257/788; 257/666
[58] Field of Search .................. 357/72, 70; 428/447; 528/15, 783, 786, 862; 174/52.2; 437/219, 211

[56] References Cited

U.S. PATENT DOCUMENTS

| | | | |
|---|---|---|---|
| 4,721,994 | 1/1988 | Mine et al. | 357/70 |
| 4,742,103 | 5/1988 | Morita et al. | 524/174 |
| 5,036,024 | 7/1991 | Mine et al. | 437/211 |

FOREIGN PATENT DOCUMENTS 86732 5/1983 Japan .

Primary Examiner—Rolf Hille
Assistant Examiner—David Ostrowski
Attorney, Agent, or Firm—Roger H. Borrousch

[57] ABSTRACT

A conductive adhesive for bonding semiconductor pellets to tabs is made from a conductive addition reaction-curing silicone rubber composition which contains $\leq 500$ ppm of low-molecular-weight siloxane which has a vapor pressure $\geq 10$ mmHg at 200° C. The conductive adhesive can contain a metal micropowder such as gold, silver, nickel or copper.

11 Claims, 1 Drawing Sheet

CONDUCTIVE ADHESIVE AND ARTICLE MADE THEREWITH

BACKGROUND OF THE INVENTION

1. Technical Field

The present invention relates to a conductive adhesive (conductive die bonding agent) for bonding a semiconductor pellet and tab (die bonding). This invention, as another embodiment, relates to a semiconductor pellet bonded to a tab through the conductive adhesive.

2. Prior Art

Semiconductor devices have a structure, for example, in which a silicon-based semiconductor pellet is bonded by a conductive adhesive, such as a conductive epoxy resin or conductive polyimide resin, to the tab which is the attachment site/support for the semiconductor pellet. The semiconductor pellet is also electrically connected to a metal inner lead frame by metal wires, and this assembly is sealed using a sealing resin such as epoxy resin. A tab and lead frame is described in U.S. Pat. No. 4,721,994, issued Jan. 26, 1988, to Mine et al. Because such a semiconductor device is constituted of various types of materials, cracking may develop in the semiconductor pellet or sealant resin in association with semiconductor pellet warming or heating during sealing with the sealant resin due to increased internal strain which originates in mechanical stresses and differences in the materials' thermal expansion. This causes changes in the performance of the semiconductor device and thus raises the drawback of a decline in its reliability.

As a particular matter, it has recently become necessary to increase both the degree of integration and mounting density of semiconductor pellets, and internal strain is promoted by the accompanying upscaling of the semiconductor pellet. Moreover, in order to increase the processability and thermal conduction of semiconductor devices as well as reduce costs, a trend has developed toward copper alloys (relatively high thermal expansion coefficient) from Ni-Fe alloys (relatively low thermal expansion coefficient) with regard to the material making up the tab and metal inner lead frame. As a consequence, the aforementioned drawback is increasingly being looked upon as a problem.

Thus, when a large-scale silicon-based semiconductor pellet is fixed on a copper tab using a prior conductive adhesive such as a conductive epoxy resin adhesive or conductive polyimide resin adhesive, stresses develop due to the difference in thermal expansivity between the copper tab and semiconductor pellet, and the curvature of the semiconductor pellet becomes large. Its properties are altered and in extreme cases cracking develops in the semiconductor pellet, and the decline in the reliability of the semiconductor device can be even greater than before.

In order to solve this problem, a semiconductor device has already been proposed in which the semiconductor pellet and tab are bonded by a conductive adhesive in the form of a conductive silicone rubber (refer to Japanese Patent Application Laid Open [Kokai or Unexamined] Number 58-86732 [86,732/83]), published May 24, 1983. This attempts to use a conductive, elastic silicone rubber to relieve the internal strain originating in the different thermal expansivities of the tab and semiconductor pellet.

PROBLEMS TO BE SOLVED BY THE INVENTION

However, the invention proposed in Japanese Patent Application Laid Open Number 58-86732 suffers from several problems. First, after the semiconductor pellet has been bonded to the tab using this conductive adhesive, one encounters a reduced bondability (wire bondability) between the bonding wires and the semiconductor pellet and between the bonding wires and copper inner lead frame when the semiconductor pellet and copper inner lead frame are connected by gold bonding wires, and this leads to a reduced reliability on the part of the semiconductor device. Moreover, the moisture resistance is reduced due to defective adhesion between the sealant resin and the semiconductor pellet, tab, and copper inner lead frame.

SUMMARY OF THE INVENTION

The present inventors conducted extensive research directed at solving the aforementioned problems, and discovered as a result, that these problems could be simultaneously solved through the use of a special conductive silicone rubber composition as the conductive adhesive which is an improvement over the adhesive of copening application filed Oct. 26, 1990, U.S. Ser. No. 07/604,843, now U.S. Pat. No. 5,145,931, entitled "Semiconductor Pellet Adhesive and Article Made Therefrom", by Kazumi Nakayoshi and Katsutoshi Mine and is hereby incorporated by reference to show the adhesive. The present invention was achieved based on this finding.

The present invention takes as its object the introduction of a conductive adhesive for bonding the semiconductor pellet and tab, wherein said conductive adhesive is distinguished by the absence, after bonding the semiconductor pellet to the tab, of any inhibition of wire bondability and by the absence of any reduction in moisture resistance due to defective adhesion between sealant resin and such semiconductor elements as the semiconductor pellet, tab, and copper inner lead frame.

MEANS SOLVING THE PROBLEMS AND FUNCTION THEREOF

The present invention relates to a conductive adhesive for bonding a semiconductor pellet and tab, wherein said conductive adhesive comprises a conductive addition reaction-curing silicone rubber composition which contains $\leq 500$ ppm low-molecular-weight siloxane which has a vapor pressure $\geq 10$ mmHg at 200° C.

An embodiment of the present invention is an article comprising a semiconductor pellet bonded to a tab with a cured adhesive comprising in the uncured form a conductive addition reaction-curing silicone rubber composition which contains $\leq 500$ ppm low-molecular-weight siloxane which has a vapor pressure $\geq 10$ mmHg at 200° C.

LIST OF REFERENCE NUMBERS WITH DEFINITIONS

1 . . . tab

Figure 1:
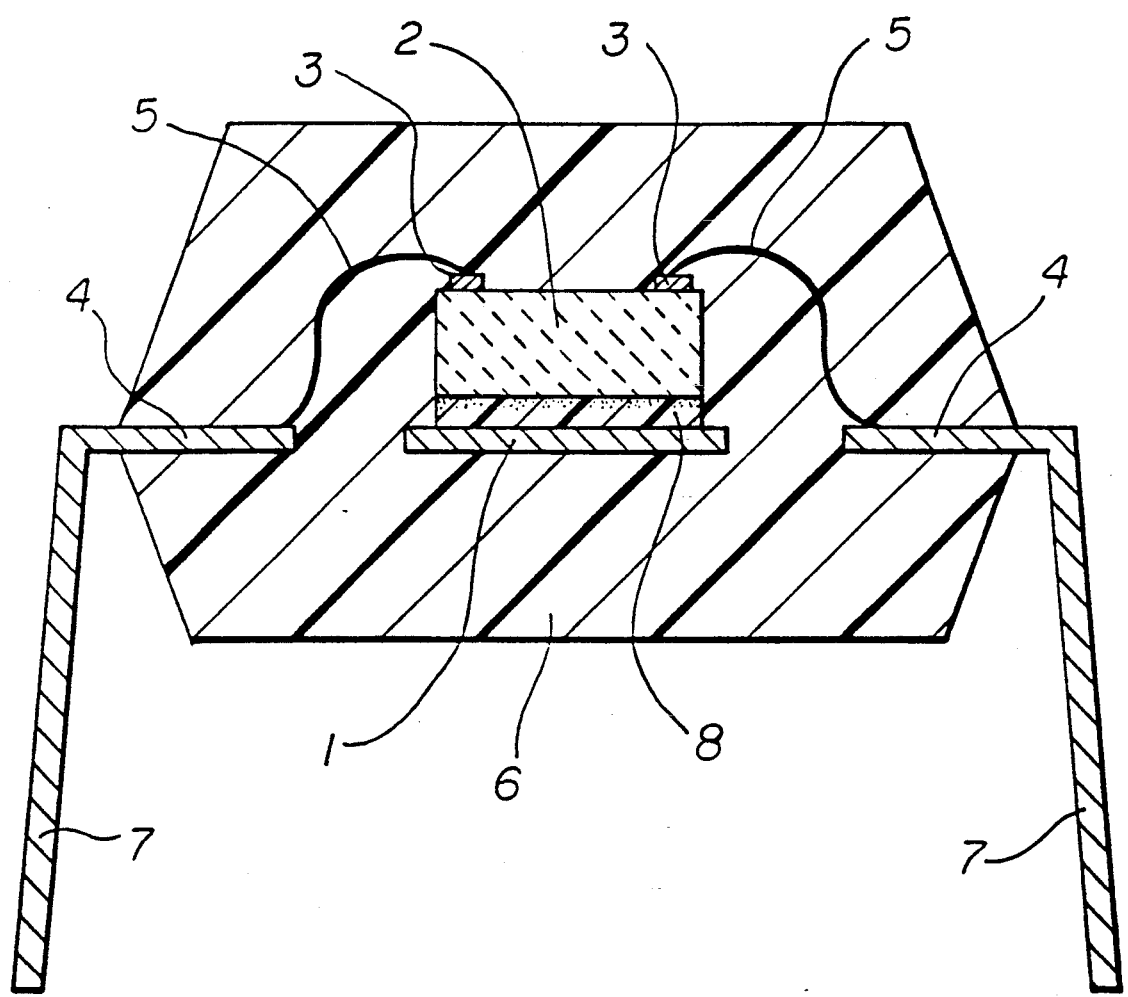
FIG. 1 contains a schematic cross section of the semiconductor device used to evaluate the properties of the conductive adhesive in the examples of the present invention.

2 ... semiconductor pellet
3 ... aluminum bonding pad
4 ... copper inner lead frame
5 ... gold wire
6 ... epoxy resin
7 ... copper outer lead frame
8 ... conductive adhesive

DESCRIPTION OF THE PREFERRED EMBODIMENTS

To explain the preceding in greater detail, the main components of the conductive addition reaction-curing silicone rubber composition used by the present invention comprise organopolysiloxane having silicon-bonded alkenyl groups, SiH-containing organopolysiloxane, hydrosilylation reaction catalyst, and conductive filler, and this composition forms a conductive silicone rubber by curing at room temperature or with heating. Within the context of the present invention, it is essential that this conductive addition reaction-curing silicone rubber composition contain $\leq 500$ ppm low-molecular-weight siloxane having a vapor pressure $\geq 10$ mmHg at 200° C. Both the wire bondability and the moisture resistance are reduced when the content of such low-molecular-weight siloxane exceeds 500 ppm. This low-molecular-weight siloxane may be linear or cyclic, and is exemplified by cyclic siloxane as represented by the following formula

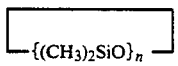

in the preceding formula, n is an integer with a value of 3 to 25 and by linear siloxane as represented by the following formula

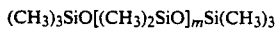

in the preceding formula, m is an integer with a value of 1 to 25. The content of this low-molecular-weight siloxane can be easily determined by extracting the low-molecular-weight siloxane from the organopolysiloxane or conductive addition reaction-curing silicone rubber composition using organic solvent and analyzing the extracted amount of gas chromatography. This can also be measured by gas chromatographic analysis of the gases developed when the conductive addition reaction-curing silicone rubber composition is heated.

The conductive addition reaction-curing silicone rubber composition of the present invention preferably consists of the following:

(A) 100 parts by weight organopolysiloxane which has at least two silicon-bonded alkenyl groups in each molecule and which contains $\leq 500$ ppm low-molecular-weight siloxane with a vapor pressure $\geq 10$ mmHg at 200° C., (B) organohydrogenpolysiloxane having at least two silicon-bonded hydrogen atoms in each molecule, in a quantity such that this component furnishes 0.5 to 3 silicon-bonded hydrogen atoms per 1 silicon-bonded alkenyl group in component (A), (C) 0 to 10 parts by weight organosilicon compound which contains a functional group as represented by —SiOR$^1$ in which R$^1$ is a monovalent hydrocarbon group, and which also contains the silicon-bonded lower alkenyl group or silicon-bonded hydrogen atom, (D) a catalytic quantity of a platinum-type catalyst, (E) 0 to 100 parts by weight microparticulate silica filler, and (F) 50 to 2,000 parts by weight conductive filler.

The organopolysiloxane having silicon-bonded alkenyl groups, component (A), comprises organopolysiloxane which has at least two silicon-bonded alkenyl groups in each molecule and which is represented by the following average unit formula

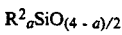

in the preceding formula, R$^2$ is a monovalent hydrocarbon group as illustrated by alkyl groups such as methyl, ethyl, propyl, and so forth, aryl groups such as phenyl, tolyl, and so forth, alkenyl groups such as vinyl, allyl, propenyl, hexenyl, and so forth; and a has a value of 1 to 3.

While this organopolysiloxane can be prepared by those methods known to the individual skilled in the art, it will generally contain as a by-product approximately 2 to 7 weight % low-molecular-weight siloxane having a vapor pressure $\geq 10$ mmHg at 200° C., such as octamethyltetracyclosiloxane, decamethylpentacyclosiloxane, dodecamethylhexacyclosiloxane, and so forth.

Organopolysiloxane comprising component (A) used by the present invention can be prepared by removing this low-molecular-weight siloxane from the aforementioned organopoly-siloxane, and numerous methods are available for this removal of low-molecular-weight siloxane. For example, useable methods include, inter alia, conversion of the organopolysiloxane into a thin film and stripping at 180° to 300° C. in a vacuum ($\leq 0.5$ mmHg), but also extraction of the low-molecular-weight siloxane by the addition to the organopolysiloxane of a solvent such as methanol, ethanol, propanol, butanol, or acetone.

As a general matter, the organopolysiloxane comprising component (A) should have a viscosity within the range of 50 to 500,000 centistokes (cs) at 25° C., while viscosities within the range of 400 to 100,000 cs are particularly suitable.

The organohydrogenpolysiloxane comprising component (B) is a crosslinker for component (A), and should contain at least 2 silicon-bonded hydrogen atoms in each molecule. Its molecular structure may be any of linear, branched, or cyclic.

This organohydrogenpolysiloxane should be admixed in a quantity sufficient for this component to furnish 0.5 to 3 silicon-bonded hydrogen atoms per alkenyl group in component (A). Quantities sufficient to provide 1 to 2 silicon-bonded hydrogen atoms are preferred. This quantity generally will not exceed 2 weight % of component (A). Furthermore, in order that component (B) contain low-molecular-weight siloxane comparable with component (A), the use is preferred of a component (B) from which the low-molecular-weight siloxane by-product has been removed, for example, by stripping at 180° to 300° C. in a vacuum $\geq 0.5$ mmHg.

The organopolysiloxane under consideration is exemplified as follows.

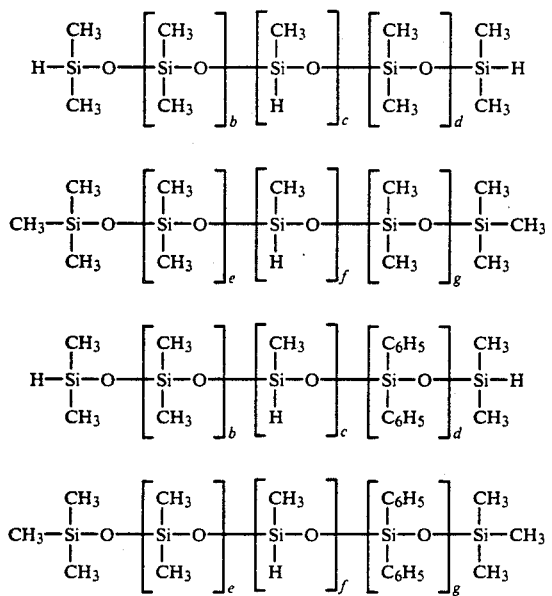

in the preceding formulas, b, c, d, e, and g are zero or a positive integer and f is an integer with a value of at least 2.

Component (C) is imparts adhesiveness to the conductive adhesive of the present invention, and it comprises an organosilicon compound which contains the functional group represented by —SiOR$^1$ in which R$^1$=monovalent hydrocarbon group such as methyl, ethyl, propyl, propenyl, etc, and which also contains the lower alkenyl group or silicon-bonded hydrogen atom. Concrete examples of this organosilicon compound are as follows:

$CH_2=CH-Si(OCH_3)_3$ $CH_2=CH-CH_2-Si(OC_2H_5)_3$

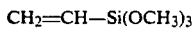

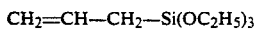

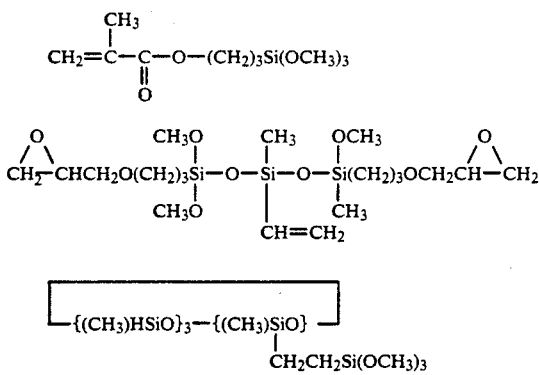

Its quantity of addition should fall within the range of 0 to 10 parts by weight and preferably 0.5 to 3.0 parts by weight per 100 parts by weight component (A).

The platinum-type catalyst comprising component (D) is a catalyst for curing the conductive adhesive of the present invention, and usable in this regard are those generally known as addition-reaction catalysts for use in the hydrosilylation reaction. Examples here are platinum black, solid platinum supported on a carrier such as alumina or silica, chloroplatinic acid, alcohol-modified chloroplatinic acid, olefin/chloroplatinic acid complexes, and platinum/vinylsiloxane complexes. On the subject of the use of these catalysts, the solid catalysts should be sufficiently fined ground, or the particle size of their supports should be small enough, to give good dispersibility, and large specific surface areas are preferred. Chloroplatinic acid and its complexes with olefin are advantageously used dissolved in a solvent such as alcohol, ketone, ether, or hydrocarbon. The quantity of addition of such catalysts should be suitably adjusted so as to afford the desired curing rate. However, with regard to those catalysts compatible with siloxane, such as chloroplatinic acid and so forth, a range of 1 to 100 ppm as platinum referred to the total quantity of components (A) and (B) is preferred for obtaining a good cured product.

The microparticulate silica filler comprising component (E) is admixed in order to impart an appropriate hardness, strength, and workability to the conductive adhesive of the present invention, and it generally comprises those fillers used in addition reaction-curing silicone rubber compositions. Such microparticulate silica fillers are exemplified by fumed silica, precipitated silica, hydrophobicized silica, and so forth. It is added at no more than 100 parts by weight per 100 parts by weight component (A).

The conductive filler comprising component (F) is the essential component for imparting electrical conductivity to the conductive adhesive of the present invention. Conductive fillers usable in the conductive adhesive of the present invention are exemplified by the micropowders of such metals as gold, silver, nickel, copper, and so forth, but also by micropowders in which a metal including gold, silver, nickel, and copper has been plated or vapor-deposited on the surface of ceramic micropowder, glass micropowder, microparticulate quartz, microparticulate organic resin, and so forth. In order to obtain a conductivity such that the conductive silicone rubber has a volume resistivity at or below 0.1 ohm-cm, usable conductive fillers comprise gold micropowder and silver micropowder, but microparticulate silver is the practical choice. This silver powder may take a spherical, flake, or dendritic flake form. Flake silver powder or dendritic flake silver powder is preferred for obtaining conductive silicone rubber with a conductivity below $1\times10-3$ ohm-cm. In the particular case of the use of a mixture of flake silver powder and dendritic flake silver powder, the mixing weight ratio of flake silver powder to dendritic flake silver powder is preferably 80/20 to 20/80. Moreover, the particle size of the silver powder should be 1 to 10 micrometers and preferably is 1 to 5 micrometers. Within the context of the present invention, component (F) is admixed at 50 to 2,000 parts by weight and preferably 300 to 600 parts by weight per 100 parts weight component (A). The conductivity which is an object of the present invention is not expressed at an addition of less than 50 parts by weight. On the other hand, the workability of the conductive adhesive is degraded at an addition in excess of 2,000 parts by weight.

The present invention is explained in greater detail with reference to the following illustrative examples. The viscosity reported in the examples was measured at 25° C. and "part" or "parts" are "part by weight" or "parts by weight" respectively.

In these examples, the content of low-molecular-weight siloxane and the properties of the conductive adhesive were measured according to the following methods.

MEASUREMENT OF LOW-MOLECULAR-WEIGHT SILOXANE CONTENT

The low-molecular-weight siloxane was extracted with acetone from the starting organopolysiloxane, and the amount extracted was measured by gas chromatography with flame ionization detector (FID).

EVALUATION OF SEMICONDUCTOR PELLET CRACKING

Conductive adhesive 8 was placed between semiconductor pellet 2 and tab 1 and heated for 1 minute at 200° C. After cooling the obtained unified assembly comprising semiconductor pellet 2 and tab 1 bonded via conductive adhesive 8, the surface of the semiconductor pellet 2 was evaluated under a microscope.

EVALUATION OF THE WIRE BONDABILITY

The aluminum bonding pads 3 on the assembly afforded by the preceding evaluation of semiconductor pellet cracking were bonded to a copper inner lead frame 4 by fold wires 5 (wire bonding) to give another unified assembly. The gold wires 5 were bonded by ultrasonic hot-press bonding. The bonding points between the gold wires 5 and aluminum bonding pads 3 and between the gold wires 5 and copper inner lead frame 4 in this assembly were then inspected. The gold wires 5 were pulled on at the same time, and defective bonding was scored when a gold wire 5 could be lifted up. The number of defective connections is reported referred to the total number of tested connections.

EVALUATION OF MOISTURE RESISTANCE

The unified assembly obtained in the aforementioned evaluation of wire bondability was sealed with epoxy resin 6 in order to manufacture a semiconductor device. This semiconductor device was then heated for the specified time in saturated steam (2 atm, 121° C.). After heating, current was applied to the semiconductor device, and the leakage current across the copper inner frame 4 was measured. The semiconductor device was scored as defective in the case of an increased leakage current and pass-through defect. The number of defects is reported relative to the total number of semiconductor devices.

MEASUREMENT OF THE CONDUCTIVITY

A 1 mm-thick cured sheet of the conductive silicone rubber was prepared and measured using a resistivity measurement instrument (K-705RL from Kyowa Riken Yugengaisha).

REFERENCE EXAMPLE 1

Disiloxane with the following formula

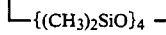

and cyclic siloxane with the following formula

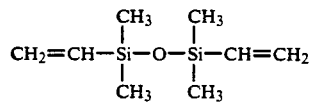

were polymerized using potassium silanolate catalyst, and a vinyl group-containing dimethylpolysiloxane (I) was obtained by neutralization.

This vinyl group-containing dimethylpolysiloxane (I) was stripped for 5 hours at 10 mmHg/180° C. in order to remove low-molecular-weight siloxane, and vinyl group-containing dimethylpolysiloxane (II) with a viscosity of 2,000 cs was obtained.

The quantities of low-molecular-weight siloxane contained in these dimethylpolysiloxanes (I) and (II) were determined by gas chromatography (GC-9A from Shimadzu Seisakujo Kabushiki Kaisha, FID): its content in dimethylpolysiloxane (I) was 20.5 weight % and its content in dimethylpolysiloxane (II) was 1.3 weight %, and the main component of the low-molecular-weight siloxane with vapor pressure $\geq 10$ mmHg at 200° C. was the cyclic dimethylpolysiloxane decamer ($D_{10}$).

Dimethylpolysiloxane (II) was additionally subjected to molecular distillation for 8 hours at 260° C./0.01 mmHg in order to remove the low-molecular-weight siloxane. The content of low-molecular-weight siloxane to the decamer ($D_{10}$) in the obtained vinyl group-containing dimethylpolysiloxane (III) was 0.01 weight %.

100 Parts dimethylpolysiloxane (III) and 300 weight parts ethanol were then stirred together for 3 hours, and the ethanol was separated after standing. This same ethanol extraction process was then repeated four times in order to remove the low-molecular-weight siloxane. The ethanol fraction in this dimethylpolysiloxane as removed by stripping for 5 hours at 180° C./10 mmHg. The content of low-molecular-weight siloxane to the decamer ($D_{10}$) in the obtained vinyl group-containing dimethylpolysiloxane (IV) was 10 ppm.

REFERENCE EXAMPLE 2

65 Parts of the vinyl group-containing dimethylpolysiloxane (III) prepared in Reference Example 1 was mixed with 35 weight copolymer (vinyl group content=25 mole %) composed of the $SiO_2$ unit, $(CH_3)_3SiO_{\frac{1}{2}}$ unit, and $(CH_3)_2(CH_2=CH)SiO_{\frac{1}{2}}$ unit. 100 Parts of this mixture and 300 parts ethanol were stirred together for 3 hours, and the ethanol was separated after standing. This same ethanol extraction process was then repeated 4 times in order to remove low-molecular-weight siloxane. The ethanol in this dimethylpolysiloxane was removed by stripping for 5 hours at 180° C./mmHg to afford a vinyl-containing dimethylpolysiloxane resin (V) having a viscosity of 9,000 cs. This dimethylpolysiloxane resin (V) contained 10 ppm low-molecular-weight siloxane to the decamer ($D_{10}$).

REFERENCE EXAMPLE 3

Disiloxane with the following formula

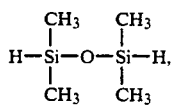

cyclic siloxane with the following formula

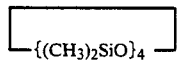

and cyclic siloxane with the following formula

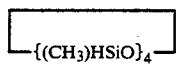

were polymerized in the presence of sulfuric acid catalyst, and neutralization afforded the SiH-containing polysiloxane (VI) with the following average formula.

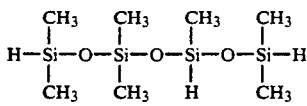

This polysiloxane (VI) was stripped for 3 hours at 180° C. under a 0.5 mmHg vacuum to give SiH-containing polysiloxane (VII) with a reduced content of low-molecular-weight siloxane. The content of low-molecular-weight siloxane to the decamer ($D_{10}$) in polysiloxanes (VI) and (VII) was 17.0 weight % in (VI) and 100 ppm in (VII).

EXAMPLE 1

100 Parts vinyl-containing polysiloxane (IV) as prepared in Reference Example 1, 200 parts dendritic flake silver powder having an average particle size of 1.3 micrometers (TC20E from Tokuriki Kagaku Kenkyujo Kabushiki Kaisha), 200 parts flake silver powder having an average particle size of 2.3 micrometers (TCG7 from Tokuriki Kagaku Kenkyujo Kabushiki Kaisha), 1.5 parts SiH-containing polysiloxane (VII) as prepared in Reference Example 3, and chloroplatinic acid/olefin complex sufficient to give 5 ppm platinum were mixed to homogeneity to give a conductive addition reaction-curing silicone rubber composition. This composition contained 10 ppm low-molecular-weight siloxane. The volatile component developed upon curing this composition (200° C./10 minutes) was measured by gas chromatography at 60 ppm. The resistivity of the conductive silicone rubber obtained by curing this composition was $3 \times 10^{-4}$ ohm-cm. This composition was then used as a conductive adhesive in semiconductor device production, and its semiconductor pellet cracking, wire bondability, and moisture resistance were measured. These results are reported in Table 1.

COMPARISON EXAMPLE

A conductive addition reaction-curing silicone rubber composition was prepared proceeding as in Example 1 with the following modifications: vinyl-containing dimethylpolysiloxane (II) was used in place of vinyl-containing dimethylpolysiloxane (IV) in Example 1, and SiH-containing polysiloxane (VI) was used in place of the SiH-containing polysiloxane (VII) prepared in Reference Example 3. This composition contained 2,800 ppm low-molecular-weight siloxane. The volatile component developed upon curing this composition (200° C./10 minutes) was measured by gas chromatography at 3,560 ppm. The resistivity of the conductive silicone rubber obtained by curing this composition was $4 \times 10^{-4}$ ohm-cm. This composition was then used as a conductive adhesive in semiconductor device production, and its semiconductor pellet cracking, wire bondability, and moisture resistance were measured as in Example 1. These results are also reported in Table 1.

TABLE 1

| | PRESENT INVENTION | COMPARISON EXAMPLE |
|---|---|---|
| Outer lead frame count | 16 pin | 16 pin |
| Semiconductor pellet size (mm × mm) | 13.5 × 4.5 | 13.5 × 4.5 |
| Number of test specimens (IC) | 30 | 30 |
| Presence/absence of semiconductor pellet cracking | absent | absent |
| Proportion of wire bonding defects | 0/480 | 38/480 |
| Proportion of moisture resistance defects: | | |
| after 48 hours | 0/30 | 1/30 |
| after 168 hours | 0/30 | 6/30 |
| after 504 hours | 0/30 | 14/30 |

EXAMPLE 2

100 Parts vinyl-containing dimethylpolysiloxane (V) as prepared in Reference Example 2, 10 parts crystalline silica, 300 parts of the same dendritic flake silver powder, TC20E as in Example 1, 2.5 parts SiH-containing polysiloxane (VIII) as prepared in Reference Example 3, 2.0 parts organosilicon compound with the following formula functioning as adhesion promoter,

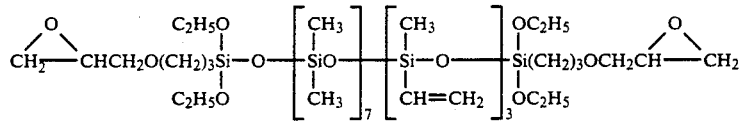

and chloroplatinic acid/methylvinylsiloxane dimer complex sufficient to give 5 ppm platinum were mixed to homogeneity to give a conductive addition reaction-curing silicone rubber composition. This composition contained 10 ppm low-molecular-weight siloxane according to measurement as in Example 1. The volatile component evolved when this composition was cured (200° C./10 minutes) was measured by gas chromatography at 43 ppm. The resistivity of the conductive silicone rubber obtained by curing this composition was $1 \times 10^{-4}$ ohm-cm. A semiconductor device was then manufactured using this composition as conductive adhesive, and its semiconductor pellet cracking, wire bondability, and moisture resistance were measured. No defects were found, and these results are reported in table 2.

TABLE 2

| | PRESENT INVENTION |
|---|---|
| Outer lead frame count | 64 pin |
| Semiconductor pellet size (mm × mm) | 10.0 × 10.0 |
| Number of test specimens (IC) | 30 |

TABLE 2-continued

| | PRESENT INVENTION |
|---|---|
| Proportion of wire bonding defects | 0/1920 |
| Proportion of moisture resistance defects: | |
| after 48 hours | 0/30 |
| after 168 hours | 0/30 |
| after 504 hours | 0/30 |

EFFECTS OF THE INVENTION

The conductive adhesive according to the present invention consists of a conductive addition reaction-curing silicone rubber composition which contains ≦500 ppm low-molecular-weight siloxane with vapor pressure ≧10 mmHg at 200° C. Accordingly, when used as a conductive adhesive (conductive die bonding agent) for bonding a semiconductor pellet to the tab, in contrast to conventional conductive addition reaction-curing silicone rubber compositions there is no reduction in wire bondability, no reduction in adhesiveness between sealant resin and semiconductor pellet surface or lead frame, and no reduction in the semiconductor device's moisture resistance. Furthermore, with regard to the bonding of the semiconductor pellet and tab with their different thermal expansion coefficients, this conductive adhesive is distinguished by its ability to reduce changes in the properties of the semiconductor device and to prevent cracking and bending of the semiconductor pellet, which derive from its capacity to absorb and reduce the stresses which develop between these two components.

That which is claimed:

1. A conductive adhesive for bonding a semiconductor pellet and tab, wherein said conductive adhesive comprises a conductive addition reaction-curing silicone rubber composition which contains ≦500 ppm low-molecular-weight siloxane which has a vapor pressure ≧100 mmHg at 200° C.

2. The conductive adhesive according to claim 1 having the characteristic that the conductive addition reaction-curing silicone rubber composition consists of
(A) 100 parts by weight organopolysiloxane which has at least two silicon-bonded alkenyl groups in each molecule and which contains ≦500 ppm low-molecular-weight siloxane with a vapor pressure ≧10 mmHg at 200° C.
(B) organohydrogenpolysiloxane having at least two silicon-bonded hydrogen atoms in each molecule, in a quantity such that this component furnishes 0.5 to 3 silicon-bonded hydrogen atoms per 1 alkenyl group in component (A),
(C) 0 to 10 parts by weight organosilicon compound which contains a functional group as represented by —SiOR$^1$ in which R$^1$ is a monovalent hydrocarbon group and which also contains the silicon-bonded lower alkenyl group or silicon-bonded hydrogen atom,
(D) a catalytic quantity of a platinum-type catalyst,
(E) 0 to 100 parts by weight microparticulate silica filler, and
(F) 50 to 2,000 parts by weight conductive filler.

3. The conductive adhesive according to claim 2 in which the conductive filler is a metal micropowder.

4. The conductive adhesive according to claim 3 in which the metal micropowder is gold, silver, nickel or copper.

5. The conductive adhesive according to claim 4 in which the metal micropowder is microparticulate silver.

6. The conductive adhesive according to claim 5 in which the microparticulate silver is flake silver powder.

7. The conductive adhesive according to claim 5 in which the microparticulate silver is a mixture of flake silver powder and dendrite flake silver powder.

8. The conductive adhesive according to claim 7 in which the weight ratio of flake silver powder to dendrite flake silver powder is 80/20 to 20/80.

9. The conductive adhesive according to claim 2 in which (C) is present in an amount of from 0.5 to 3 parts by weight.

10. An article comprising a semiconductor pellet bonded to a tab with a cured adhesive comprising in the uncured form a conductive addition reaction-curing silicone rubber composition which contains ≦500 ppm low-molecular-weight siloxane which has a vapor pressure ≧10 mmHg at 200° C.

11. In a method of making a semiconductor device comprising a semiconductor pellet bonded to a tab with an adhesive, the improvement consisting essentially of using a conductive adhesive for bonding a semiconductor pellet and tab, wherein said conductive adhesive comprises a conductive addition reaction-curing silicone rubber composition which contains ≦500 ppm low-molecular-weight siloxane which has a vapor pressure ≧10 mmHg at 200° C. to bond the semiconductor pellet to the tab by placing the conductive adhesive between them and then curing the conductive adhesive.

* * * * *